(12) United States Patent
Zhang et al.

(10) Patent No.: US 12,550,686 B2
(45) Date of Patent: Feb. 10, 2026

(54) WAFER TOTAL THICKNESS VARIATION USING MASKLESS IMPLANT

(71) Applicant: Applied Materials, Inc., Santa Clara, CA (US)

(72) Inventors: Qintao Zhang, Mt Kisco, NY (US); Ludovico Megalini, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 228 days.

(21) Appl. No.: 18/534,327

(22) Filed: Dec. 8, 2023

(65) Prior Publication Data
US 2025/0191917 A1    Jun. 12, 2025

(51) Int. Cl.
*H01L 21/033* (2006.01)
*H01J 37/304* (2006.01)
*H01L 21/311* (2006.01)
*H01L 21/66* (2006.01)

(52) U.S. Cl.
CPC ........ *H01L 21/0337* (2013.01); *H01J 37/304* (2013.01); *H01L 21/0332* (2013.01); *H01L 21/31116* (2013.01); *H01L 22/12* (2013.01); *H01J 2237/3151* (2013.01)

(58) Field of Classification Search
None
See application file for complete search history.

(56) References Cited

U.S. PATENT DOCUMENTS 10,157,752 B2 * 12/2018 Ting .................... H01L 21/0335
11,456,179 B2 *  9/2022 Sung .................... H10D 84/038

* cited by examiner

*Primary Examiner* — Roberts P Culbert
(74) *Attorney, Agent, or Firm* — KDW Firm PLLC (57) ABSTRACT

Embodiments herein are directed to localized wafer thickness correction. In some embodiments, a method may include providing a substrate including an upper surface having a raised portion extending above a plane defined by the upper surface, and a non-raised portion adjacent the raised portion. The method may further include performing a metrology scan of the upper surface to determine a first dimension of the raised portion and a second dimension of the non-raised portion, and depositing a hardmask over the upper surface, including over the raised portion and the non-raised portion. The method may further include directing ions to the hardmask, wherein a first dose of the ions over the raised portion is greater than a second dose of the ions over the non-raised portion, and performing a first etch to the hardmask to remove the hardmask over the raised portion, wherein the hardmask remains over the non-raised portion.

15 Claims, 7 Drawing Sheets

WAFER TOTAL THICKNESS VARIATION USING MASKLESS IMPLANT

FIELD

The disclosure relates to substrate processing and, more particularly, to improvement of wafer total thickness variation using a maskless implant.

BACKGROUND

Devices such as integrated circuits, memory devices, and logic devices may be fabricated on a substrate such as a silicon wafer by a combination of deposition processes, etching, ion implantation, annealing, and other processes. Generally, certain requirements are established for the flatness and thickness uniformity of the wafers. Despite best efforts, variations in the wafers often occur. Such variations may lead to errors in downstream processes, for example, during lithographic patterning, epitaxial formation, or the like.

It is with respect to these and other considerations the present embodiments are provided.

SUMMARY OF THE DISCLOSURE

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, a method may include a method may include providing a substrate including an upper surface having a raised portion extending above a plane defined by the upper surface, and a non-raised portion adjacent the raised portion. The method may further include performing a metrology scan of the upper surface to determine a first dimension of the raised portion and a second dimension of the non-raised portion, and depositing a hardmask over the upper surface, including over the raised portion and the non-raised portion. The method may further include directing ions to the hardmask, wherein a first dose of the ions over the raised portion is greater than a second dose of the ions over the non-raised portion, and performing a first etch to the hardmask to remove the hardmask over the raised portion, wherein the hardmask remains over the non-raised portion.

In another embodiment, a method of processing a substrate may include performing a metrology scan of an upper surface of the substrate to determine a first dimension of a raised portion of the upper surface and a second dimension of a non-raised portion of the upper surface, and depositing a hardmask over the upper surface, including over the raised portion and the non-raised portion. The method may further include directing ions to the hardmask over the raised portion and the non-raised portion, wherein a first dose of the ions over the raised portion is greater than a second dose of the ions over the non-raised portion, and performing a first etch to the hardmask to remove the hardmask over the raised portion, wherein the hardmask remains over the non-raised portion.

In yet another embodiment, a beam-line ion implanter may include an ion source for generating an ion beam, and an end station including a platen for supporting a substrate to be implanted by the ion beam and metrology components for analyzing the substrate. The beam-line ion implanter may further include a main controller operatively coupled to the ion source and the metrology components, wherein the main controller is adapted to cause the metrology components to perform a metrology scan of an upper surface of the substrate to determine a first dimension of a raised portion of an upper surface of the substrate and a second dimension of a non-raised portion of the upper surface. The main controller may be further operable to cause a hardmask to be deposited over the upper surface, including over the raised portion and over the non-raised portion, and to cause the ion source to direct ions to the hardmask over the raised portion and the non-raised portion, wherein a first dose of the ions over the raised portion is greater than a second dose of the ions over the non-raised portion. The main controller may be further operable to initiate a first etch to the hardmask to remove the hardmask over the raised portion, wherein the hardmask remains over the non-raised portion.

BRIEF DESCRIPTION OF THE DRAWINGS

The accompanying drawings illustrate exemplary approaches of the disclosure, including the practical application of the principles thereof, as follows.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity.

The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so the disclosure will be thorough and complete, and will fully convey the scope of the subject matter to those skilled in the art.

Provided herein are approaches for improved ion implantation control for the purpose of mitigating wafer total thickness variation (TTV), which can be as high as 10 μm in some cases. In some approaches, an incoming wafer is measured (e.g., scanned) to determine local thickness measurements at a plurality of locations across the wafer, followed by deposition of a dielectric hardmask. Based on the TTV, a required dose rate and energy is determined for a subsequent ion implant to the hardmask. Variations in the dose across the hardmask will cause certain areas of the hardmask to be etched faster, namely those areas of the wafer including raised portions. A wet and/or dry etch may then be performed to remove the hardmask and the raised portions of the wafer to reduce TTV in an efficient manner.

Figure 1:
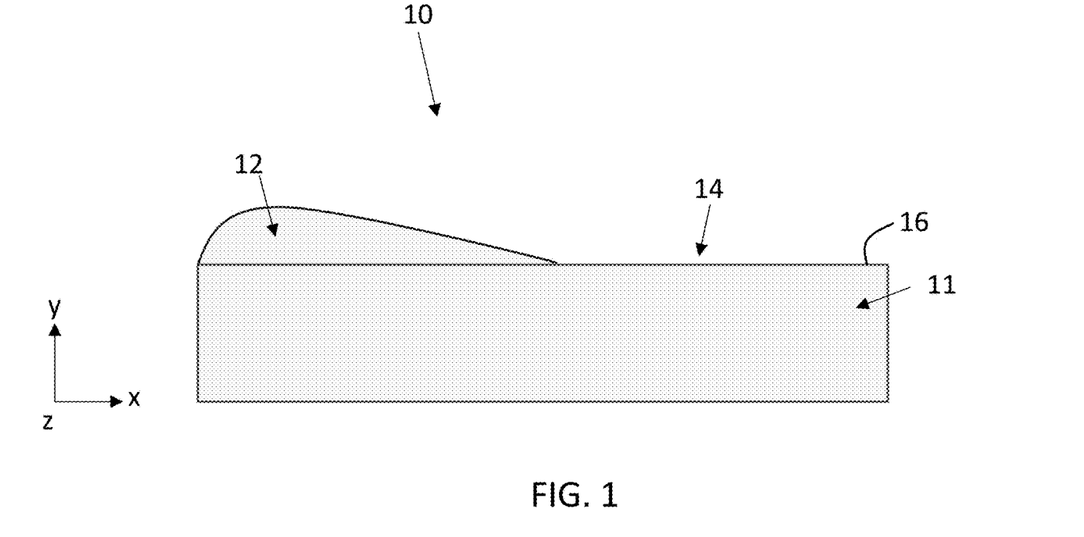
FIG. 1 depicts a side cross-sectional view of a substrate including a raised portion adjacent a non-raised portion, according to embodiments of the present disclosure.

FIG. 1 depicts a side cross-sectional view of a portion of a device 10 according to embodiments of the present disclosure. The device 10 may include a wafer or substrate 11 having an upper surface 16. The substrate 11 may include a raised portion 12 adjacent a non-raised portion 14, wherein the raised portion 12 may extend above a plane (e.g., x-z plane) defined by the upper surface 16. As shown, the non-raised portion 14 may be parallel to, or extend along, the plane defined by the upper surface 16. In other embodiments, the non-raised portion 14 may represent a depression or indentation extending below the plane defined by the upper surface 16. Although non-limiting, the substrate 11 may be silicon carbide (SiC). Furthermore, although only a single raised portion 12 and a single non-raised portion 14 are shown, it will be appreciated that the substrate 11 may include a plurality of raised portions 12 and a plurality of non-raised portions 14. As will be described in greater detail herein, a metrology scan may be performed to determine one or more localized dimensions of both the plurality of raised portions 12 and the plurality of non-raised portions 14. In some embodiments, the localized dimensions may include a height of the raised portions 12 extending from the plane defined by the upper surface 16. The localized dimensions will then be used to influence properties of a subsequent ion treatment, as will be discussed in greater detail herein.

Figure 2:
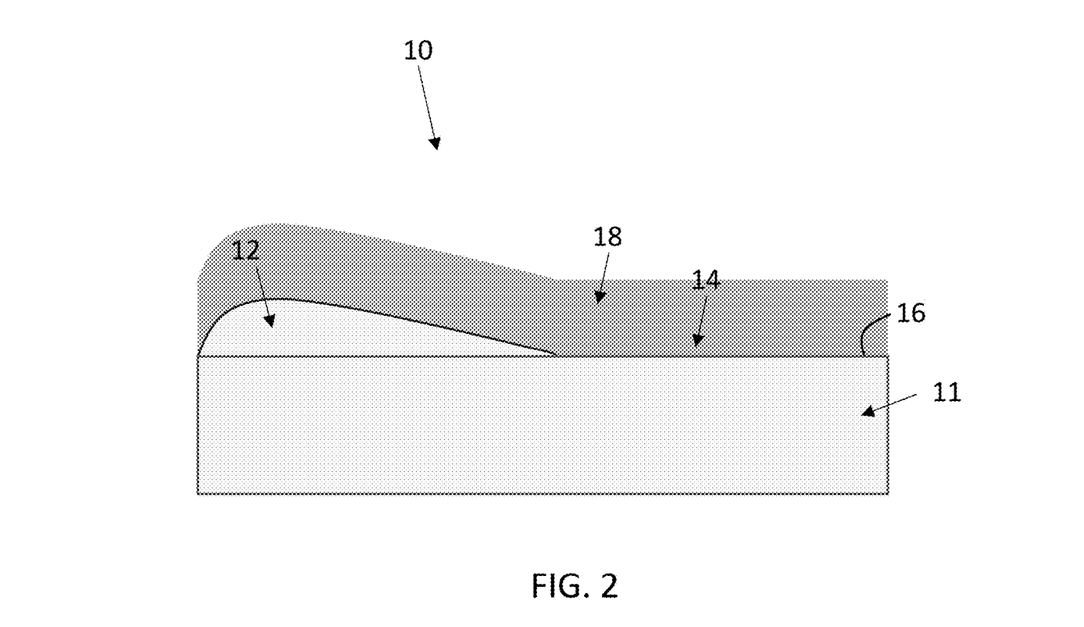
FIG. 2 depicts a side cross-sectional view of the substrate including a hardmask, according to embodiments of the present disclosure.

As shown in FIG. 2, a hardmask 18 may be formed over the substrate 11. More specifically, the hardmask 18 may be deposited directly atop the upper surface 16 of the substrate 11, including over the raised portion 12 and the non-raised portion 14. As shown, the hardmask 18 may have a substantially constant thickness (e.g., in the y-direction) over both the raised portion 12 and the non-raised portion 14 for simplicity of processing. In other embodiments, thickness of the hardmask 18 may vary across the substrate 11. Although non-limiting, the hardmask 18 may be a dielectric, such as silicon dioxide (SiO2).

Figure 3:
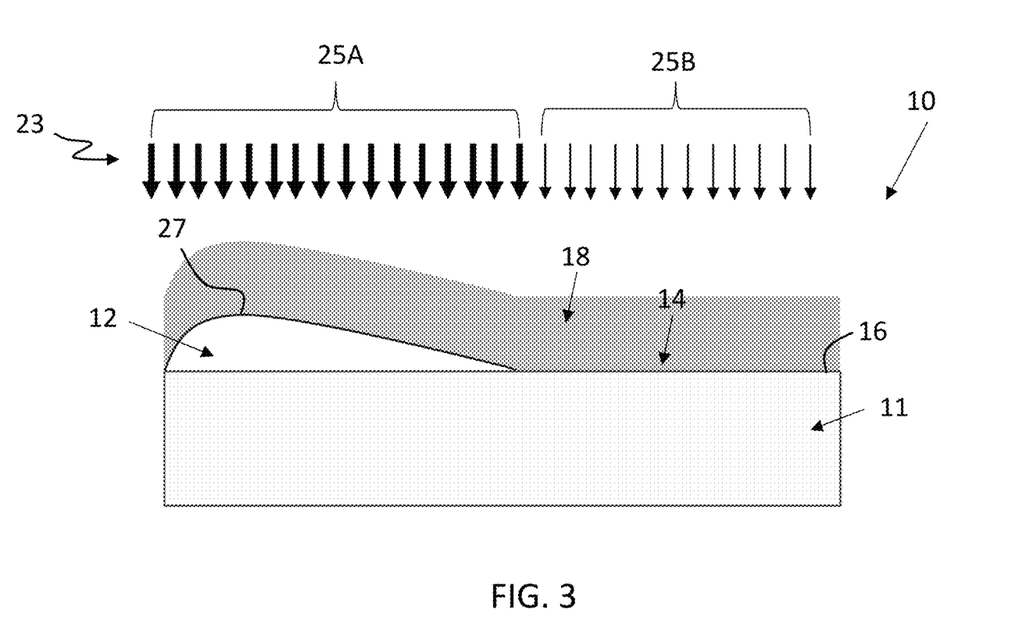
FIG. 3 depicts a side cross-sectional view of the substrate during an ion treatment, according to embodiments of the present disclosure.

As shown in FIG. 3, an ion treatment 23 may then be performed to deliver ions to the hardmask 18. Advantageously, the ion treatment 23 is performed without the use of an additional blocking mask positioned over the hardmask 18 for the purpose of influencing location of the ion treatment 23 to the hardmask 18. Instead, the ion treatment 23 may include one or more ion implants (e.g., scanned spot or ribbon ion beam implant), which may impact all of the hardmask 18, but which may be delivered with a different dose and/or implant energy to different areas of the hardmask 18. For example, ions 25A may be delivered to the hardmask 18 in an area over the raised portion 12, while ions 25B may be delivered to the hardmask 18 in an area over the non-raised portion 14. A first dose of ions 25A may be greater than a second dose of ions 25B. As a result, an etch rate of the hardmask 18 over the raised portion 12 may be greater than an etch rate of the hardmask 18 over the non-raised portion.

Although non-limiting, the first dose may be between 5E13/cm2-5E16 and the second dose may be between 10 to 20 times smaller than the first dose. It will be appreciated that more than two different doses may be provided to the hardmask 18. For example, a third (e.g., higher) dose may be supplied to a peak 27 of the raised portion 12. A species of ions 25A and/or ions 25B may be carbon, boron, oxygen, nitrogen, phosphorous, and fluorine. Furthermore, an implant energy of the ion treatment 23 may be between 10 KeV to 1000 KeV.

Figure 4:
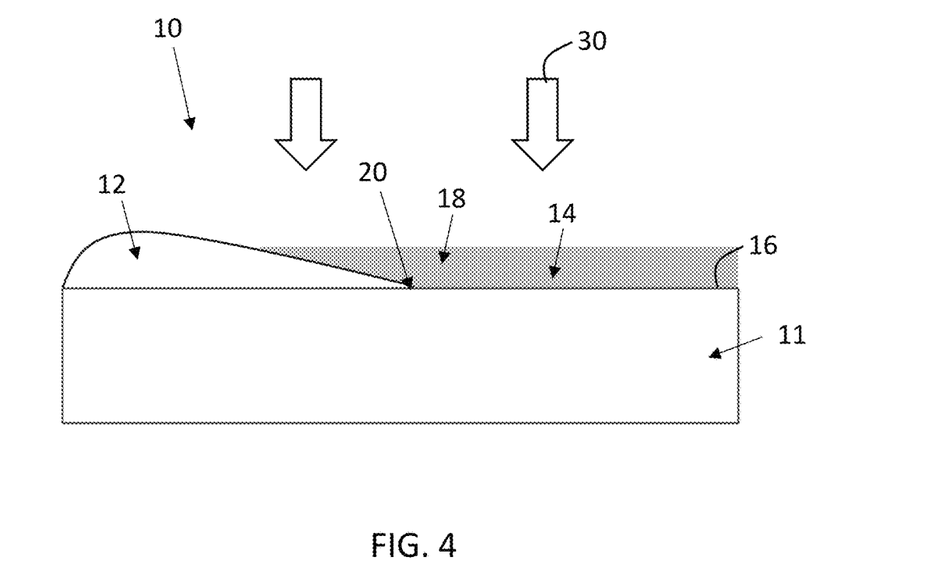
FIG. 4 depicts a side cross-sectional view of the substrate following a first etch, according to embodiments of the present disclosure.

As shown in FIG. 4, a first etch process 30 may then be performed to partially remove the hardmask 18. More specifically, the hardmask 18 over the raised portion 12 is mostly removed, although a portion remains over an edge 20 of the raised portion 12. Meanwhile, the hardmask 18 over the non-raised portion 14 has been recessed by not entirely removed. Approximately 1 um of material of the hardmask 18 may remain over the non-raised portion 14, for example. The remaining thickness of hardmask 18 material can be thicker depending on height of the raised portion 14. In some embodiments, the first etch process 30 may be a wet etch using a dilute hydrofluoric acid (e.g., 100:1 water: HF). In other embodiments, the first etch process 30 may be a dry etch.

Figure 5:
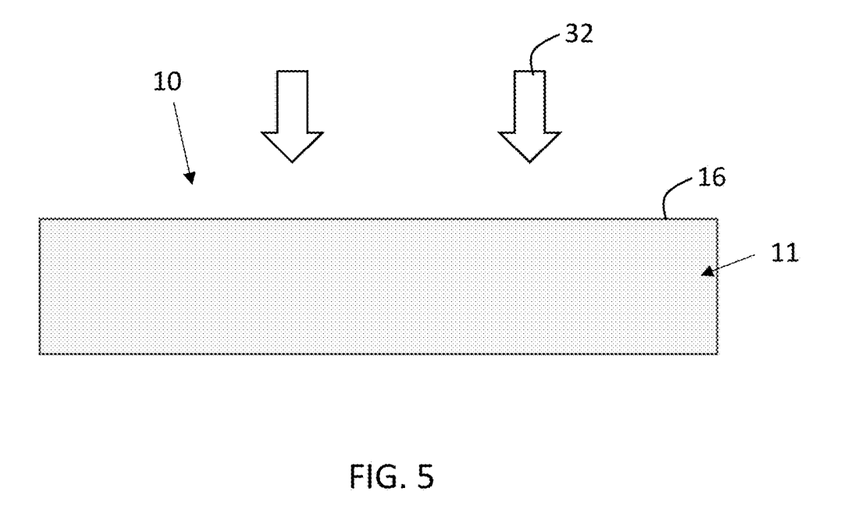
FIG. 5 depicts a side cross-sectional view of the substrate following a second etch, according to embodiments of the present disclosure.

As shown in FIG. 5, a second etch process 32 may be performed to remove the raised portion 12 and the hardmask 18 selective to the upper surface 16 of the substrate 11. In some embodiments, the second etch process 32 may be a dry etch while the first etch process 30 is a wet etch. In other embodiments, the second etch process 32 may be a continuation of the first etch process 30. It will be appreciated that one or more additional etch processes may be performed following the second etch process 32, as needed. Once complete, an overall thickness of the substrate 11 is more uniform across the upper surface 16. If desired, a final etch step, wet or dry, can be applied to remove hardmask residues, and another wafer scan may be performed to determine an improvement to TTV of the substrate 11.

Figure 6:
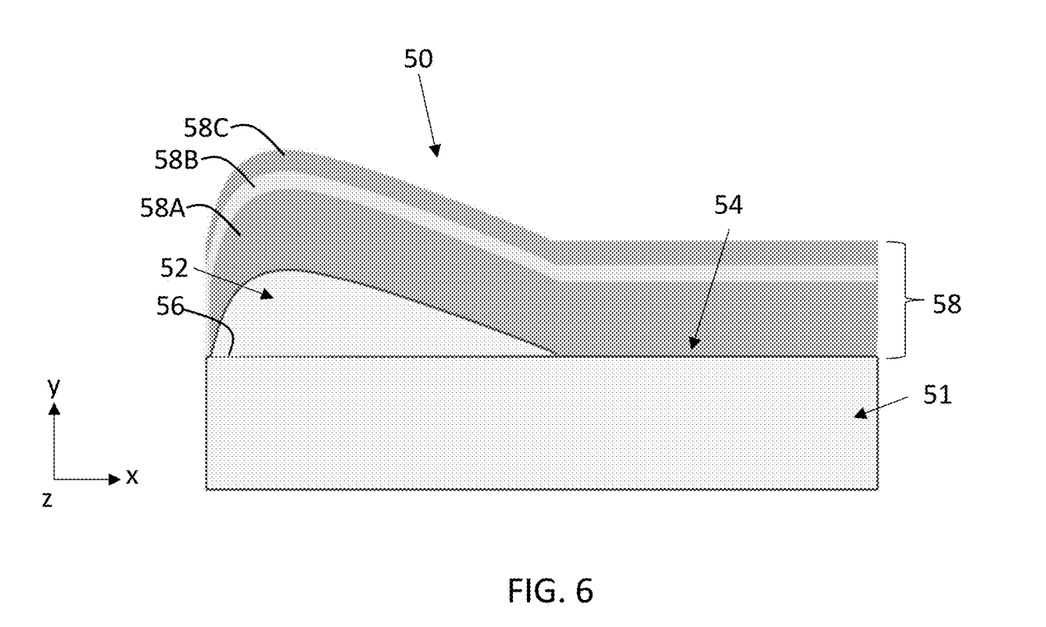
FIG. 6 depicts a side cross-sectional view of a substrate including a multi-layer hardmask, according to embodiments of the present disclosure.

Referring to FIG. 6, another device 50 will be described. The device 50 may be the same or similar in many aspects to the device 10 described above. As such, only certain features of the device 50 will hereinafter be described for the sake of brevity. As shown, the device 50 may include a wafer or substrate 51 having an upper surface 56. The substrate 51 may include a raised portion 52 adjacent a non-raised portion 54, wherein the raised portion 52 may extend above a plane (e.g., x-z plane) defined by the upper surface 56.

As further shown, a multi-layered hardmask 58 may be formed over the substrate 51, including over the raised portion 52 and the non-raised portion 54. In this embodiment, the hardmask 58 may include a first dielectric layer 58A (e.g., SiO2) formed directly atop the upper surface 56, an amorphous carbon layer 58B formed over the first dielectric layer 58A, and a second dielectric layer 58C (e.g., SiO2) formed over the amorphous carbon layer 58B. Although non-limiting, a first thickness of the first dielectric layer 58A may be greater than a second thickness of the second dielectric layer 58C.

Figure 7:
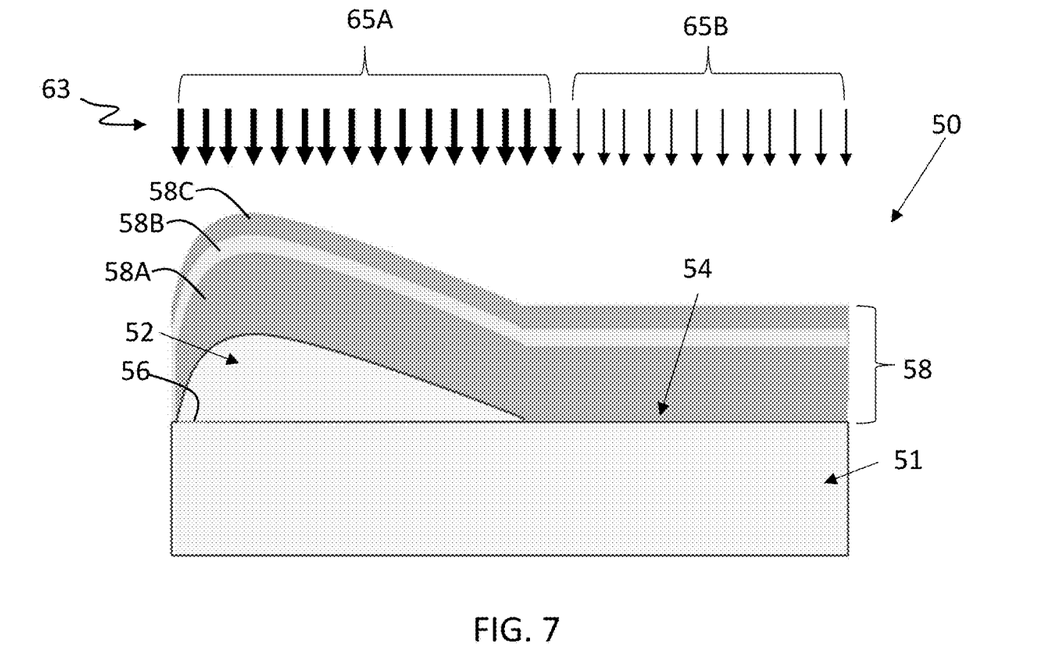
FIG. 7 depicts a side cross-sectional view of the substrate during an ion treatment to the multi-layer hardmask, according to embodiments of the present disclosure.

As shown in FIG. 7, an ion treatment 63 may then be performed to deliver ions to the hardmask 58. Advantageously, the ion treatment 63 is performed without the use of an additional blocking mask positioned over the hardmask 58. The ion treatment 63 may include one or more ion implants (e.g., scanned spot or ribbon ion beam implant), which may impact the entire hardmask 68, but which may be delivered with a different dose and/or implant energy to different areas of the hardmask 58. For example, ions 65A may be delivered to the hardmask 58 in an area over the raised portion 52, while ions 65B may be delivered to the hardmask 58 in an area over the non-raised portion 54. A first dose of ions 65A may be greater than a second dose of ions 65B so as to increase an etch rate of the hardmask 58 over the raised portion 52 relative to the non-raised portion 54. Although non-limiting, the first dose may be between 5E13/cm2-5E16 and the second dose may be between 10× to 20× smaller than the first dose. Furthermore, a species of ions 65A and/or ions 65B may be carbon, boron, oxygen, nitrogen, phosphorous, and fluorine, while the implant energy of the ion treatment 63 may be between 10 KeV to 200 KeV.

Figure 8:
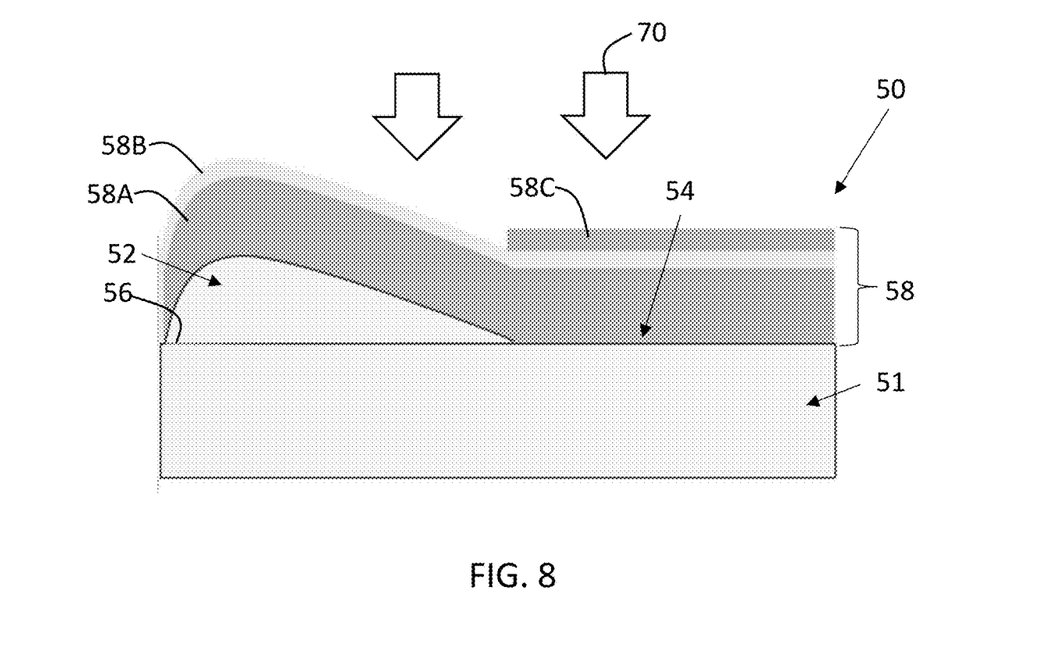
FIG. 8 depicts a side cross-sectional view of the substrate and multi-layered hardmask following a first etch, according to embodiments of the present disclosure.

As shown in FIG. 8, a first etch process 70 may then be performed to partially remove the hardmask 58. That is, the second dielectric layer 58C is removed from over the raised portion 52, but not from over the non-raised portion 54. This etch rate different is determined by the implantation-dose dependent etch rate. Removal of the second dielectric layer 58C may expose the amorphous carbon layer 58B over the raised portion 52. In some embodiments, the first etch process 70 may be a wet etch using a dilute hydrofluoric acid (e.g., 100:1 water:HF). In other embodiments, the first etch process 70 may be a dry etch.

Figure 9:
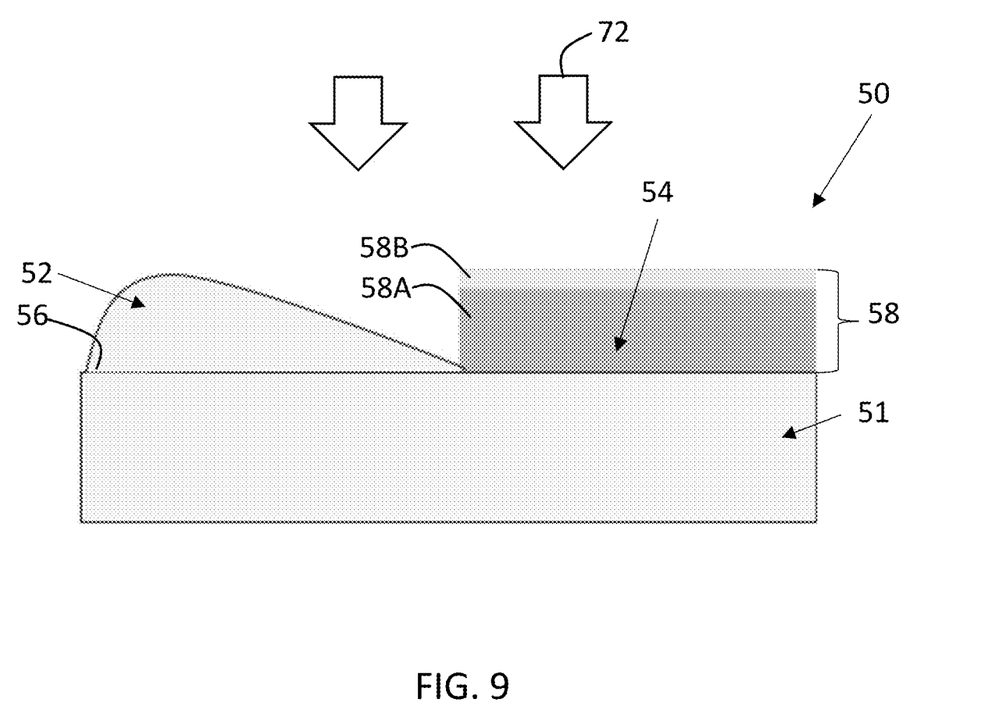
FIG. 9 depicts a side cross-sectional view of the substrate and the multi-layered hardmask following a second etch, according to embodiments of the present disclosure.

As shown in FIG. 9, a second etch process 72 may be performed to remove the remaining layers of the hardmask 58 from over the raised portion 52, selective to the upper surface 56 of the substrate 51. In some embodiments, the second etch process 72 may be a wet or dry etch. Following the second etch process 72, the hardmask 58 remains only over the non-raised portion 54.

Figure 10:
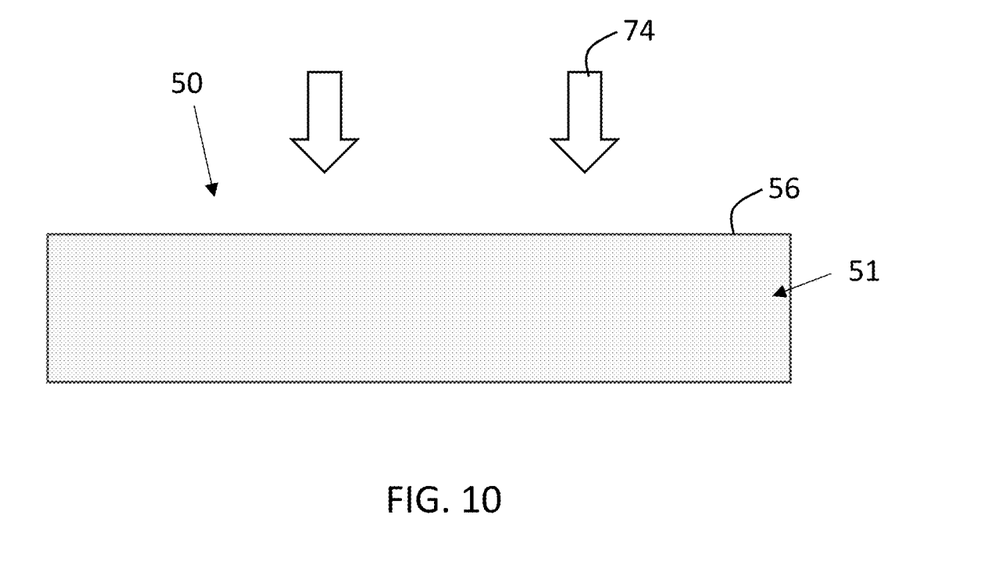
FIG. 10 depicts a side cross-sectional view of the substrate following a third etch, according to embodiments of the present disclosure.

As shown in FIG. 10, a third etch process 74 may be performed to remove the remaining layers of the hardmask 58 from over the non-raised portion 54 and to remove the raised portion 52 selective to the upper surface 56 of the substrate 51. In some embodiments, the third etch process 74 may be a wet or dry etch. Following the third etch process 74, an overall thickness of the substrate 51 is more uniform across the upper surface 56. If desired, a final etch step, wet or dry, can be applied to remove hardmask residues and another wafer scan may be performed to determine an improvement to TTV of the substrate 51.

Figure 11:
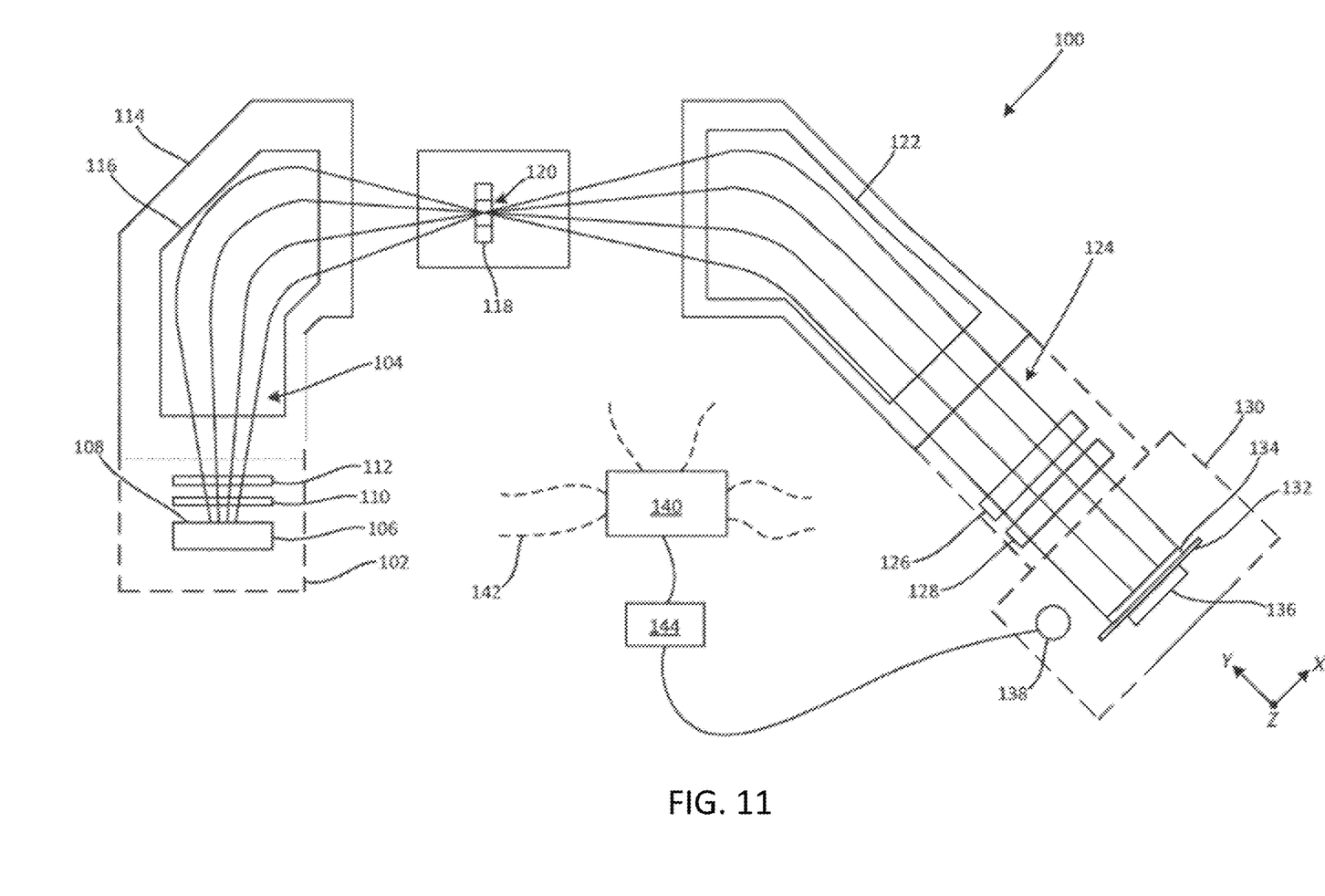
FIG. 11 is a schematic view illustrating an exemplary embodiment of a beam-line ion implanter, according to embodiments of the present disclosure.

The devices and methods disclosed herein are described in connection with an ion implanter used in the processing of workpieces such as, for example, semiconductor substrates 11 and 51. FIG. 11 is a schematic diagram illustrating an exemplary beam-line ion implanter 100 operable to perform the processes shown in FIGS. 1-10 and described herein. The beam-line ion implanter 100 is one of many examples of beam-line ion implanters capable of producing and directing ions for processing workpieces.

In general, the beam-line ion implanter 100 (hereinafter "the implanter 100") may include an ion source 102 adapted to generate ions for forming an ion beam 104. The ion source 102 may include an ion chamber 106 where the ions are produced. The ion species may be, or may include or contain, hydrogen, helium, oxygen, nitrogen, arsenic, boron, phosphorus, aluminum, indium, gallium, antimony, carborane, other rare gases, alkanes, another large molecular compound, or other p-type or n-type dopants. The present disclosure is not limited in this regard. The generated ions may be extracted from the ion chamber 106 by a series of extraction electrodes to form the ion beam 104. In particular, the ions may be extracted from chamber 106 by an extraction electrode 108 (e.g., integral with an exit aperture of the ion chamber 106), a suppression electrode 110, and a ground electrode 112.

The ion beam 104 is mass analyzed by mass analyzer 114 having a resolving magnet 116 and a masking electrode 118 having a resolving aperture 120. The resolving magnet 116 deflects ions in the ion beam 104 to isolate ions having a desired mass-to-charge ratio associated with a particular dopant ion species subsequently allowed to pass through the resolving aperture 120. Undesired ion species are deflected into, and blocked, by the masking electrode 118 and thus do not pass through the resolving aperture 120.

Ions of the desired ion species pass through resolving aperture 120 to an angle corrector magnet 122. The angle corrector magnet 122 deflects ions of the desired ion species and converts the ion beam from a diverging ion beam to a focused ion beam 124 (e.g., a ribbon beam or a spot beam) having generally parallel ion trajectories. The implanter 100 may further include acceleration unit 126 and/or a deceleration unit 128. The acceleration and deceleration units 126, 128 may be used to speed up or slow down the focused ion beam 124. Speed adjustment is accomplished by applying specific combinations of voltage potentials to sets of electrodes disposed on opposite sides of the focused ion beam 124. As the focused ion beam 124 passes between the electrodes, ion energies are increased or decreased depending on the applied voltage potentials. Since the depth of an ion implant is proportional to the energy and dose of the impinging ion beam, beam acceleration may be desirable when performing deep ion implants. Conversely, where shallow ion implants are desired, beam deceleration is performed to ensure the impinging ions travel only a short distance into the workpiece.

An end station 130 of the implanter 100 may include a platen 132 configured to support one or more workpieces, such as substrate 134, which may be the same or similar to substrates 11 and 51 described herein. The substrate 134 may be disposed in the path of the focused ion beam 124 and ions of the desired ion species may be implanted into the substrate 134. The substrate 134 may be, for example, a semiconductor wafer, solar cell, etc. The end station 130 may include a scanner 136 adapted to move the platen 132 and the substrate 134 perpendicular to the long dimension of the focused ion beam 124 (i.e., along the X-axis of the illustrated Cartesian coordinate system) for distributing ions over the entire surface of the substrate 134. The scanner 136 may further be adapted to move the platen 132 and the substrate 134 parallel to the long dimension of the focused ion beam 124 (i.e., along the Y-axis of the illustrated Cartesian coordinate system). The scanner 136 may further be adapted to tilt or rotate the platen 132 and the substrate 134 relative to the focused ion beam 124 (e.g., rotate the platen 132 and the substrate 134 about the Y-axis of the illustrated Cartesian coordinate system). The present disclosure is not limited in this regard. The implanter 100 may include additional components known to those skilled in the art and may incorporate hot or cold implantation of ions in some embodiments.

The implanter 100 may further include one or more metrology components 138. The metrology components 138 may include, and are not limited to, an ellipsometer, a reflectometer, a pyrometer, an X-ray diffractometer, etc. The metrology components 138 may facilitate the analysis/measurement of various aspects, features, and characteristics of the substrate 134 before and after ion beam processing is performed. For example, the metrology components 138 may be used to analyze the substrate 134 prior to processing to determine one or more dimensional aspects of a plurality of raised portions and a plurality of non-raised portions. In another example, the metrology components 138 may be used to analyze/measure the depth, profile, quality, etc., of an implantation after processing. The present disclosure is not limited in this regard.

The implanter 100 may further include a main controller 140 operatively coupled to one or more of the ion source 102, the mass analyzer 114, the angle corrector magnet 122, the acceleration unit 126, the deceleration unit 128, the scanner 136, the metrology components 138, etc., by various data lines (as indicated by the dashed lines 142) for controlling and coordinating the operation of the aforementioned components. The main controller 140 may include a processor, such as a known type of microprocessor, dedicated semiconductor processor chip, general purpose semiconductor processor chip, or similar device. The main controller 140 may further include a memory or memory unit coupled to the processor, where the memory unit contains a control routine for controlling the operation of the components of the implanter 100 in a predetermined manner based on various inputs as further described below.

The memory unit of the main controller 140 may comprise an article of manufacture. In one embodiment, the memory unit may comprise any non-transitory computer readable medium or machine-readable medium, such as an optical, magnetic or semiconductor storage. The storage medium may store various types of computer executable instructions to implement one or more of logic flows described herein. Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The embodiments are not limited in this context.

The implanter 100 may further include a feedforward controller 144 operatively coupled to the metrology components 138 and to the main controller 140. As described in greater detail below, the feedforward controller 144 may be adapted to receive information from the metrology components 138 and to influence the main controller 140 to operate various components of the implanter 100 to improve the precision and efficiency of implantation processes performed by the implanter 100. For example, prior to implantation of the substrate 134, the feedforward controller 144 may receive X-ray diffraction measurements of the substrate 134 from the metrology components 138 and may use such measurements to determine wafer total thickness variations (TTV) at various locations of the substrate 134.

The feedforward controller 144 may use the dimensional data to modify a subsequent ion implant using a predictive model, wherein historical data relating to the performance of the implanter 100, as determined by measurements taken after previous implantation processes, may be used to adjust the dose of the ion implant to compensate for unintended thickness variations or imperfections across the substrate 134.

Like the main controller 140, the feedforward controller 144 may include a processor, such as a known type of microprocessor, dedicated semiconductor processor chip, general purpose semiconductor processor chip, or similar device. The feedforward controller 144 may further include a memory or memory unit coupled to the processor. The memory unit of the feedforward controller 144 may comprise an article of manufacture. In one embodiment, the memory unit may comprise any non-transitory computer readable medium or machine readable medium, such as an optical, magnetic or semiconductor storage. The storage medium may store various types of computer executable instructions to implement one or more of logic flows described herein (e.g., the predictive model described below). Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The embodiments are not limited in this context.

Figure 12:
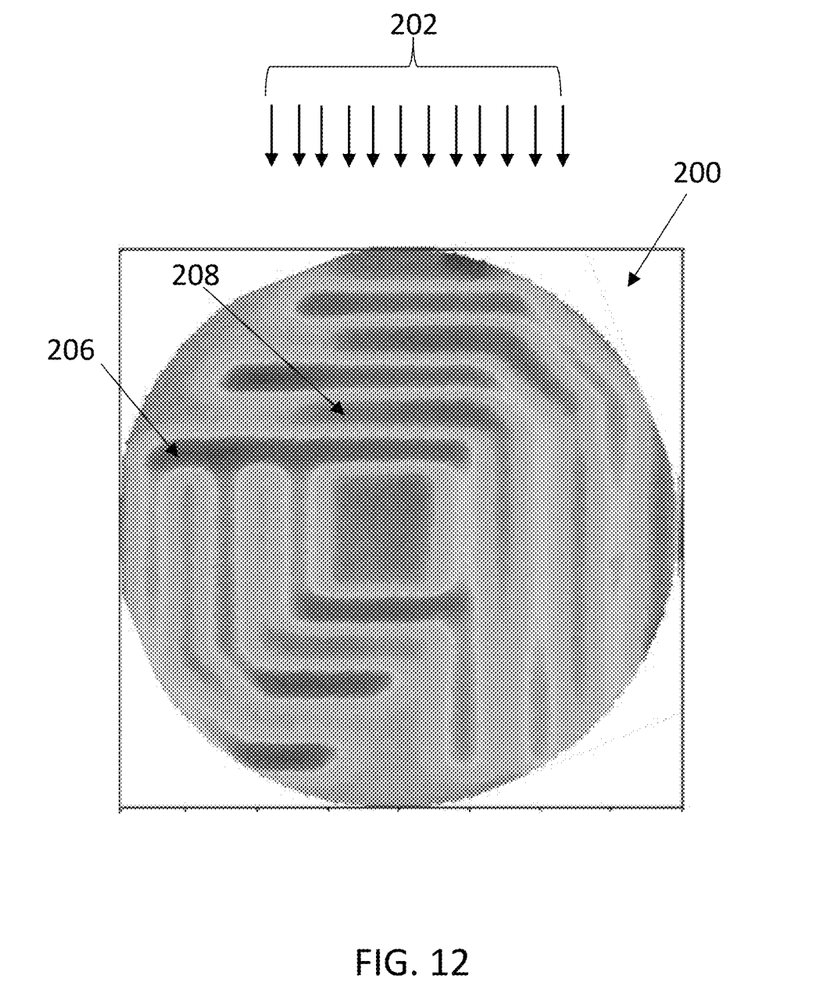
FIG. 12 is a top view of an example dose map for a substrate, according to embodiments of the present disclosure.

FIG. 12 is a top view of a dose map 200 for an example substrate, which may be the same or similar to the substrates 11, 51 described herein. The dose map 200 may be a topography map, which is characterized by a plurality of coordinates and dimensional information corresponding to the plurality of coordinates. As discussed above, the incoming substrate may be subject to a metrology scan 202, which recognizes dimensional data for a plurality of raised portions and a plurality of non-raised portions across the substrate. In some embodiments, the scan 202 may be part of Superscan™ routine. The dose map 200 may then be generated, which may be two-dimensional (2-D), to identify those areas 206 of the substrate requiring a higher dose and those areas 208 of the substrate requiring a lower dose. In general, areas 206 requiring a higher dose correlate to raised portions of the substrate, while areas 208 requiring a lower dose correlate to the non-raised portions of the substrate. In some embodiments, the Superscan™ procedure can implant varied shapes on the substrate with as high as 20:1 dose ratio.

In sum, described herein are approaches for reducing, and potentially eliminating, wafer TTV by selectively etching thicker wafer regions using a Superscan™-enabled flexible hardmask.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. However, it should be understood that various features of the certain aspects, embodiments, or configurations of the disclosure may be combined in alternate aspects, embodiments, or configurations. Moreover, the following claims are hereby incorporated into this Detailed Description by this reference, with each claim standing on its own as a separate embodiment of the present disclosure.

What is claimed is:

1. A method, comprising:
   providing a substrate, wherein the substrate comprises an upper surface having:
      a raised portion extending above a plane defined by the upper surface; and
      a non-raised portion adjacent the raised portion;
   performing a metrology scan of the upper surface to determine a first dimension of the raised portion and a second dimension of the non-raised portion;
   depositing a hardmask over the upper surface, including over the raised portion and the non-raised portion;
   directing ions to the hardmask, wherein a first dose of the ions over the raised portion of the hardmask is greater than a second dose of the ions over the non-raised portion of the hardmask; and
   performing a first etch to the hardmask to remove the hardmask over the raised portion, wherein the hardmask remains over the non-raised portion.

2. The method of claim 1, further comprising performing a second etch to remove the raised portion and the hardmask over the raised portion.

3. The method of claim 2, wherein the first etch is a wet etch, and wherein the second etch is a dry etch.

4. The method of claim 1, wherein the raised portion comprises silicon carbide, and wherein the hardmask comprises silicon dioxide.

5. The method of claim 1, wherein the first dimension corresponds to a first height extending perpendicular to the plane defined by the upper surface, and wherein the second dimension corresponds to a second height extending perpendicular to the plane defined by the upper surface.

6. The method of claim 1, wherein the hardmask comprises:
   a first dielectric layer formed atop the upper surface of the substrate;
   an amorphous carbon layer formed over the first dielectric layer; and
   a second dielectric layer formed over the amorphous carbon layer.

7. The method of claim 1, wherein the metrology scan generates a topography map of the upper surface of the substrate, and wherein the topography map is characterized by a plurality of coordinates and dimensional information correlated to each of the plurality of coordinates.

8. The method of claim 6, further comprising modifying, based on the dimensional information, the first dose of the ions or the second dose of the ions.

9. The method of claim 1, wherein the ions are directed to the hardmask without the use of a blocking mask positioned over the hardmask.

10. A method of processing a substrate, comprising:
    performing a metrology scan of an upper surface of the substrate to determine dimensional data for a raised portion of the upper surface and for a non-raised portion of the upper surface;
    depositing a hardmask over the upper surface, including over the raised portion and the non-raised portion;
    directing ions to the hardmask over the raised portion and the non-raised portion, wherein a first dose of the ions over the raised portion is greater than a second dose of the ions over the non-raised portion; and
    performing a first etch to the hardmask to remove the hardmask over the raised portion, wherein the hardmask remains over the non-raised portion.

11. The method of claim 10, further comprising performing a second etch to remove the hardmask over the raised portion and to remove the raised portion, wherein the first etch is a wet etch, and wherein the second etch is a dry etch.

12. The method of claim 10, wherein the raised portion comprises silicon carbide, and wherein the hardmask comprises silicon dioxide.

13. The method of claim 10, wherein the first dimension corresponds to a first height extending perpendicular to a plane defined by the non-raised portion of the upper surface, and wherein the second dimension corresponds to a second height extending perpendicular to the plane defined by the non-raised portion of the upper surface.

14. The method of claim 10, wherein the hardmask comprises:

a first dielectric layer formed atop the upper surface of the substrate;

an amorphous carbon layer formed over the first dielectric layer; and a second dielectric layer formed over the amorphous carbon layer.

15. The method of claim 10, wherein the metrology scan generates a topography map of the upper surface of the substrate, wherein the topography map is characterized by a plurality of coordinates and the dimensional information correlated to each of the plurality of coordinates, and wherein the first dose of the ions or the second dose of the ions is modified based on the dimensional information.

* * * * *